(12) United States Patent
Zhang

(10) Patent No.: US 11,490,539 B2
(45) Date of Patent: Nov. 1, 2022

(54) EXPANSION CARD FRAME AND SERVER CHASSIS

(71) Applicants: Inventec (Pudong) Technology Corporation, Shanghai (CN); INVENTEC CORPORATION, Taipei (TW)

(72) Inventor: Shuai Zhang, Shanghai (CN)

(73) Assignees: INVENTEC (PUDONG) TECHNOLOGY CORPORATION, Shanghai (CN); INVENTEC CORPORATION, Taipei (TW)

(*) Notice: Subject to any disclaimer, the term of this patent is extended or adjusted under 35 U.S.C. 154(b) by 0 days.

(21) Appl. No.: 17/348,950

(22) Filed: Jun. 16, 2021

(65) Prior Publication Data
US 2022/0272861 A1 Aug. 25, 2022

(30) Foreign Application Priority Data
Feb. 20, 2021 (CN) .......................... 202110193687.5

(51) Int. Cl.
H05K 7/14 (2006.01)
(52) U.S. Cl.
CPC ................................ H05K 7/1488 (2013.01)
(58) Field of Classification Search
None
See application file for complete search history.

(56) References Cited

U.S. PATENT DOCUMENTS

| | | | | |
|---|---|---|---|---|
| 11,096,306 B1* | 8/2021 | Xu | ......................... | G06F 1/189 |
| 11,163,343 B1* | 11/2021 | Lin | ......................... | G06F 1/188 |
| 2008/0100994 A1* | 5/2008 | Fan | ......................... | G06F 1/185 |
| | | | | 361/679.02 |
| 2012/0020037 A1* | 1/2012 | Chiu | ....................... | G06F 1/185 |
| | | | | 361/759 |
| 2012/0145859 A1* | 6/2012 | Chiu | ....................... | G06F 1/186 |
| | | | | 248/231.81 |
| 2012/0281373 A1* | 11/2012 | Bohannon | ............ | H05K 7/1489 |
| | | | | 361/756 |
| 2013/0027891 A1* | 1/2013 | Fan | ......................... | G06F 1/186 |
| | | | | 361/748 |
| 2013/0107441 A1* | 5/2013 | Zhou | ....................... | G06F 1/185 |
| | | | | 248/298.1 |
| 2013/0322006 A1* | 12/2013 | Sun | ......................... | G06F 1/187 |
| | | | | 361/679.31 |

(Continued)

Primary Examiner — James Wu
Assistant Examiner — Christopher L Augustin
(74) Attorney, Agent, or Firm — Locke Lord LLP; Tim Tingkang Xia, Esq.

(57) ABSTRACT

An expansion card frame is configured to be mount on a casing of a server chassis and is configured for installations of a riser card and an expansion card. The expansion card frame includes a side plate and a top plate. The side plate is configured for the installation of the riser card. The riser card is configured for an insertion of the expansion card. The top plate is connected to a side of the side plate and configured to cover the riser card. The top plate has at least one assembling structure, and the at least one assembling structure of the top plate is configured to be assembled with at least one assembling structure of an assembling frame so that the top plate, the side plate, and the assembling frame together form an accommodation space for accommodating a disk drive.

4 Claims, 7 Drawing Sheets

(56) References Cited

U.S. PATENT DOCUMENTS

| | | | | |
|---|---|---|---|---|
| 2014/0106595 A1* | 4/2014 | Zhu | ................ | H01R 13/62 |
| | | | | 439/345 |
| 2015/0115120 A1* | 4/2015 | Yu | ................ | G06F 1/186 |
| | | | | 248/220.21 |
| 2020/0229311 A1* | 7/2020 | Wu | ................ | G06F 1/185 |
| 2021/0373618 A1* | 12/2021 | Chen | ................ | H05K 7/1487 |
| 2021/0385961 A1* | 12/2021 | Hsieh | ................ | H05K 7/1431 |
| 2022/0114130 A1* | 4/2022 | Lin | ................ | G06F 13/4221 |

\* cited by examiner

EXPANSION CARD FRAME AND SERVER CHASSIS

CROSS-REFERENCE TO RELATED APPLICATIONS

This non-provisional application claims priority under 35 U.S.C. § 119(a) on Patent Application No(s). 202110193687.5 filed in China on Feb. 20, 2021, the entire contents of which are hereby incorporated by reference.

TECHNICAL FIELD OF THE INVENTION

The invention relates to a cage and a server chassis, more particularly to an expansion card frame and a server chassis having the expansion card frame and an assembling frame assembled with each other to accommodate a disk drive.

DESCRIPTION OF THE RELATED ART

As technology develops and progresses, a server is widely used in various field. In order to meet the requirement, the users can selectively increase the quantities of the expansion cards and the disk drives in the server to improve its performance.

In general, the expansion card is installed on an exclusive expansion card frame, and the disk drive is installed on an exclusive disk drive cage, and therefore the expansion card frame is unable to be used for the installation of the disk drive or another purpose, causing the expansion card frames of the inventory to be idle and not sufficiently utilized. Therefore, it is difficult to reduce the inventory of the expansion card frames.

SUMMARY OF THE INVENTION

The invention provides an expansion card frame and a server chassis facilitating the reduction of the inventory of the expansion card frames.

One embodiment of the invention provides an expansion card frame. The expansion card frame is configured to be mount on a casing of a server chassis and is configured for installations of a riser card and an expansion card. The expansion card frame includes a side plate and a top plate. The side plate is configured for the installation of the riser card. The riser card is configured for an insertion of the expansion card. The top plate is connected to a side of the side plate and configured to cover the riser card. The top plate has at least one assembling structure, and the at least one assembling structure of the top plate is configured to be assembled with at least one assembling structure of an assembling frame so that the top plate, the side plate, and the assembling frame together form an accommodation space for accommodating a disk drive.

Another embodiment of the invention provides a server chassis. The server chassis is configured to accommodate a disk drive. The server chassis includes a casing, an expansion card frame, and an assembling frame. The expansion card frame includes a side plate, a top plate, and a bottom plate. The top plate and the bottom plate are respectively connected to two opposite sides of the side plate. Two opposite sides of the assembling frame are respectively fixed to the top plate and the bottom plate of the expansion card frame so that the expansion card frame and the assembling frame together form a disk drive cage having an accommodation space, the accommodation space is configured to accommodate the disk drive. The disk drive cage is mounted on the casing As the expansion card frames and the server chassis discussed in the above embodiments, the expansion card frame not only can be used for the installation of the expansion card, but also can be assembled with the assembling frame to form the disk drive cage for accommodating the disk drive. As such, the expansion card frame can be served as a part of the disk drive cage so as to reduce the inventory of the expansion card frames.

BRIEF DESCRIPTION OF THE DRAWINGS

The present invention will become better understood from the detailed description given herein below and the accompanying drawings which are given by way of illustration only and thus are not intending to limit the present invention and wherein.

DETAILED DESCRIPTION

Figure 1:
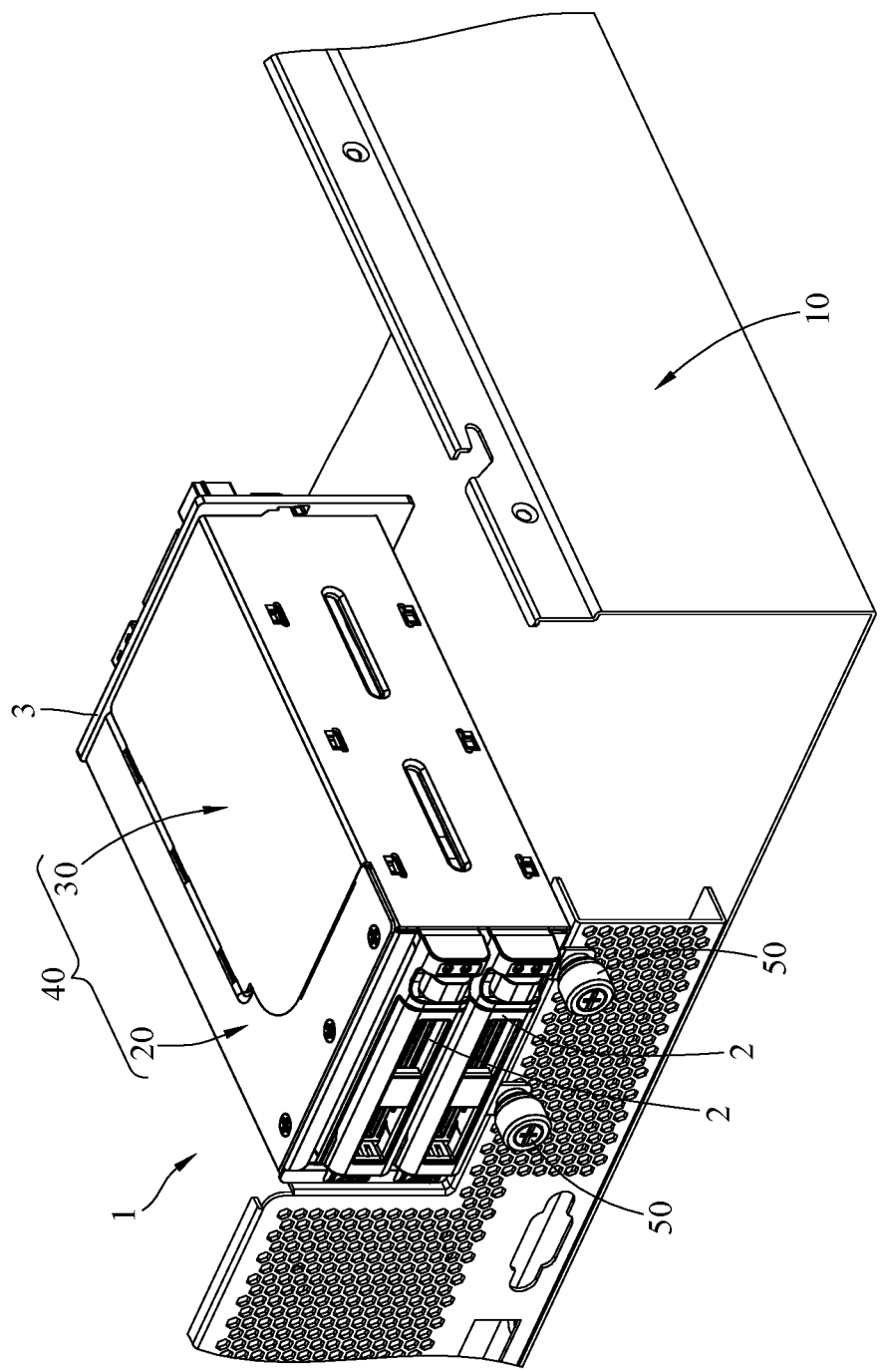
FIG. 1 is a partial perspective view of a server chassis according to a first embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the following embodiments are disclosed by the figures, and some practical details are described in the following paragraphs, but the present invention is not limited thereto. Furthermore, for the purpose of illustration, some of the structures and components in the figures are simplified, and wires, reference lines or buses are omitted in some of the figures.

Moreover, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
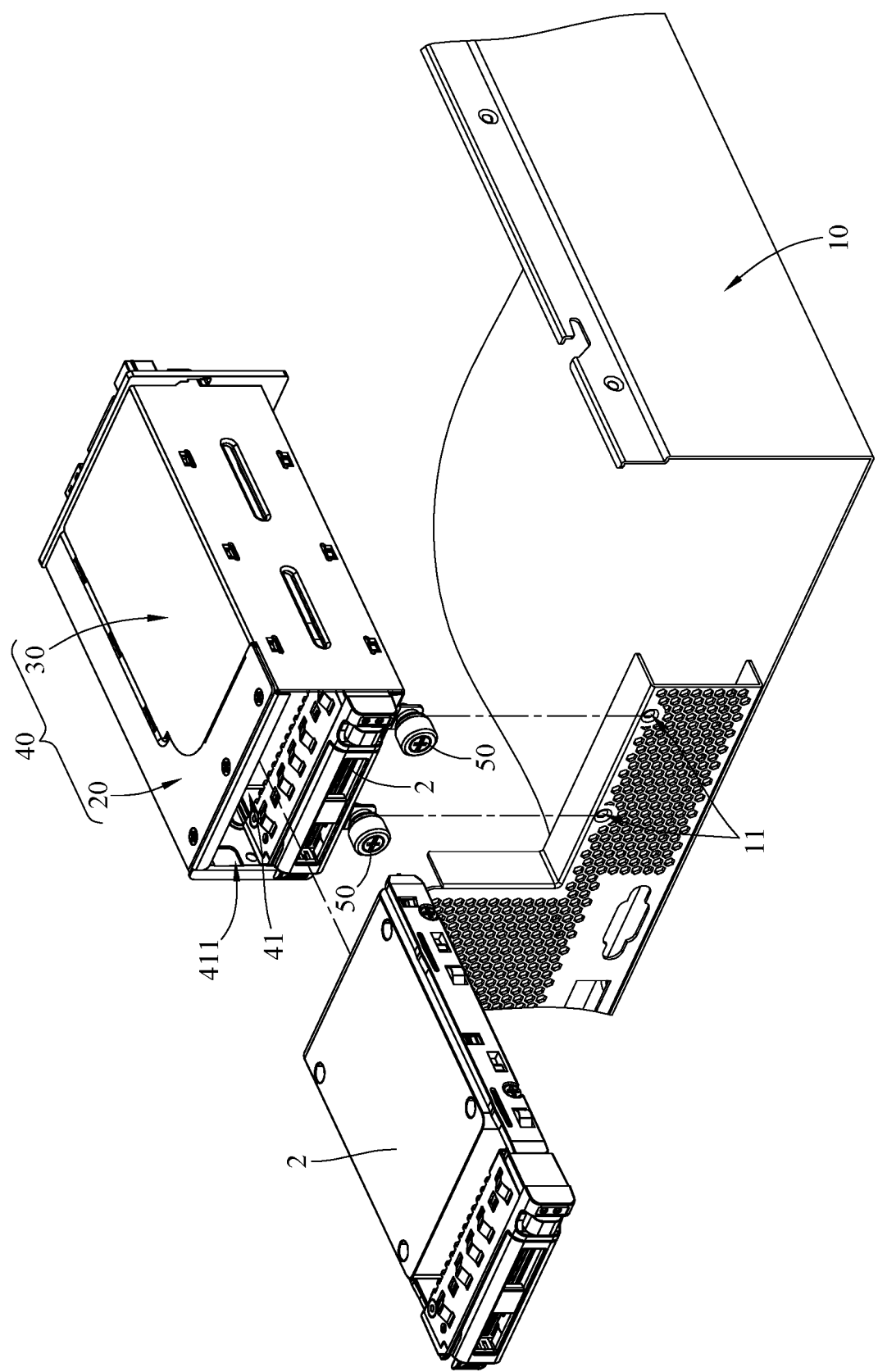
FIG. 2 is an exploded view of the server chassis in FIG. 1.

Referring to FIGS. 1 and 2, there are shown a partial perspective view of a server chassis 1 according to a first embodiment of the invention and an exploded view of the server chassis 1 in FIG. 1.

In this embodiment, the server chassis 1 includes a casing 10, an expansion card frame 20, an assembling frame 30. The casing 10 is, for example, a server casing. The casing 10 has two screw holes 11. The screw holes 11 are located at the rear portion of the casing. The purpose of the screw holes 11 will be introduced in later paragraphs.

Figure 3:
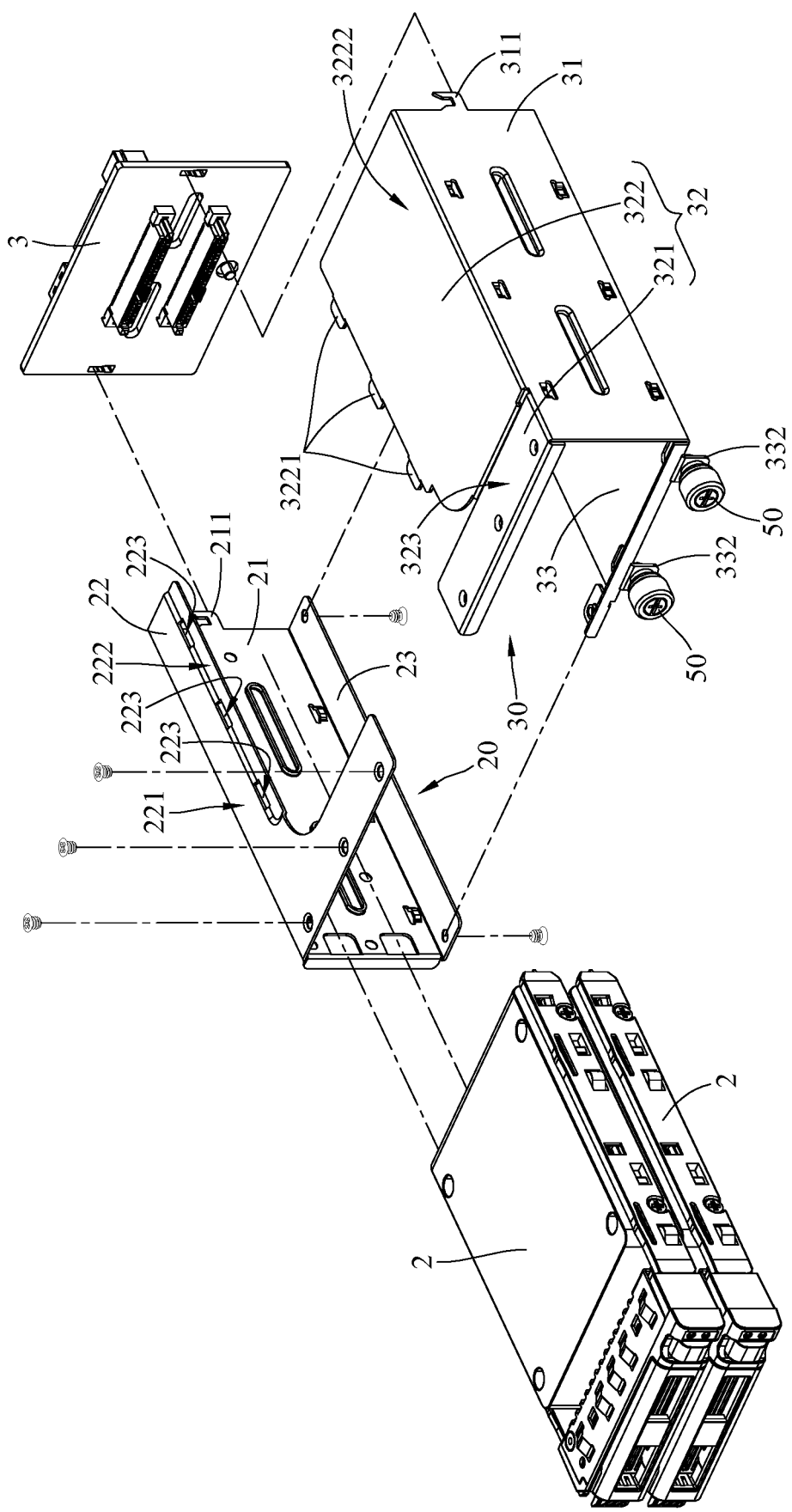
FIG. 3 is an exploded view of an expansion card frame and an assembling frame of the server chassis, disk drives, and a circuit board in FIG. 2.
Figure 4:
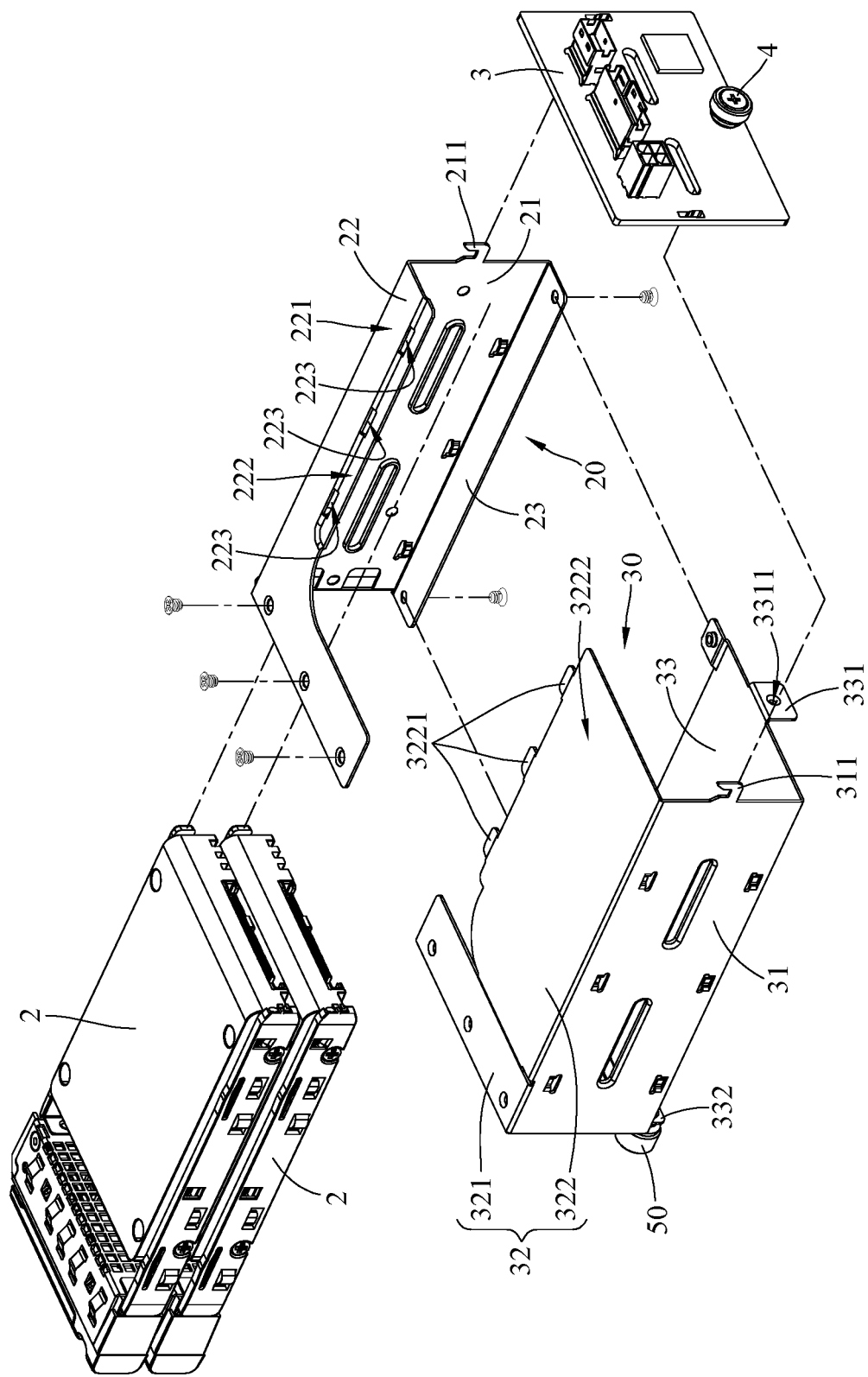
FIG. 4 is another exploded view of the expansion card frame and the assembling frame of the server chassis, the disk drives, and the circuit board in FIG. 2.

Then, referring to FIGS. 3 and 4, there are shown an exploded view of the expansion card frame 20 and the assembling frame 30 of the server chassis 1, disk drives 2, and a circuit board 3 in FIG. 2 and another exploded view of the expansion card frame 20 and the assembling frame 30 of the server chassis 1, the disk drives 2, and the circuit board 3 in FIG. 2.

The expansion card frame 20 includes a side plate 21, a top plate 22, and a bottom plate 23. The top plate 22 and the bottom plate 23 are respectively connected to two opposite sides of the side plate 21. The top plate 22 has an outer surface 221, a recess 222, and a plurality of assembling structures 223. The outer surface 221 of the top plate 22 faces away from the bottom plate 23. The recess 222 is formed at the outer surface 221 of the top plate 22. The assembling structures 223 are, for example, insertion holes. The assembling structures 223 are spaced apart from each other and located in the recess 222.

The assembling frame 30 includes a side plate 31, a top plate 32, and a bottom plate 33. The top plate 32 and the bottom plate 33 are respectively connected to two opposite sides of the side plate 31. The top plate 32 includes a first plate portion 321 and a second plate portion 322. The first plate portion 321 is located closer to the bottom plate 33 than the second plate portion 322 such that a recess 323 of the top plate 32 is formed above the first plate portion 321. The second plate portion 322 has a plurality of assembling structures 3221 spaced apart from each other. The assembling structures 3221 are, for example, protrusions.

The top plate 22 of the expansion card frame 20 is stacked on the first plate portion 321 of the top plate 32 of the assembling frame 30 so as to be located in the recess 323, and the top plate 22 is fixed to the first plate portion 321 of the top plate 32 of the assembling frame 30 via screwing. The assembling structures 3221 of the second plate portion 322 of the top plate 32 of the assembling frame 30 are respectively inserted into the assembling structures 223 of the top plate 22 of the expansion card frame 20. The bottom plate 33 of the assembling frame 30 are fixed to the bottom plate 23 of the expansion card frame 20 via screwing. The second plate portion 322 of the top plate 32 of the assembling frame 30 is partially located in the recess 222 of the top plate 22 of the expansion card frame 20. An outer surface 3222 of the second plate portion 322 of the top plate 32 of the assembling frame 30 faces away from the bottom plate 33 and is flush with the outer surface 221 of the top plate 22 of the expansion card frame 20; that is, the outer surface 3222 of the second plate portion 322 and the outer surface 221 of the top plate 22 are on the same plane. In this embodiment, the expansion card frame 20 and the assembling frame 30 together form a disk drive cage 40 having an accommodation space 41. The accommodation space 41 is configured to accommodate the disk drives 2. The disk drives 2 are, for example, a 2.5 or 3.5-inch disk drives.

Note that the types of the assembling structures 3221 and 223 are not intended to limit the invention and may be modified; in some other embodiments, the assembling structures of the second plate portion of the top plate of the assembling frame may be insertion holes, and the assembling structures of the top plate of the expansion card frame may be protrusions. In such a configuration, the top plate of the expansion card frame may not have recess, and the second plate portion of the top plate of the assembling frame may have a recess (e.g., similar with the recess 222 of the top plate 22 of the expansion card frame 20). As such, after the assembling structures of the top plate of the expansion card frame are inserted into the assembling structures of the second plate portion of the top plate of the assembling frame, the top plate of the expansion card frame may be partially located in the recess of the second plate portion of the top plate of the assembling frame.

Note that the first plate portion 321 and the second plate portion 322 of the top plate 32 of the assembling frame 30 are not restricted to be spaced apart from the bottom plate 33 by different distances; in some other embodiments, the first plate portion and the second plate portion may be spaced apart from the bottom plate by the same distance.

In addition, the assembling frame 30 and the expansion card frame 20 are not restricted to be fixed to each other via screwing; in some other embodiments, the assembling frame and the expansion card frame may be fixed to each other via another manner, such as adhering manner or snap-fit manner.

In this embodiment, the accommodation space 41 has an opening 411. The side plate 31 of the assembling frame 30 has a hook portion 311 located at a side of the side plate 31 away from the opening 411. The side plate 21 of the expansion card frame 20 has a hook portion located at a side of the side plate 21 away from the opening 411. The bottom plate 33 of the assembling frame 30 has an extension portion 331 located at a side of the bottom plate 33 away from the opening 411. The extension portion 331 extends away from the top plate 32 of the assembling frame 30. The extension portion 331 has a screw hole 3311. The hook portions 311 and 211 are configured to hook on a circuit board 3 into which the disk drives 2 are inserted, and a thumb screw 4 disposed on the circuit board 3 is configured to be screwed into the screw hole 3311.

Note that the quantities of the hook portions 311 and 211 are not intended to limit the invention and may be modified; in some other embodiments, the side plate of the assembling frame or the side plate of the expansion card frame may not have any hook portion, or both of them may not have any hook portion, and the circuit board may be fixed on the disk drive cage merely via the screwing. On the other hand, the extension portion 331 of the bottom plate 33 of the assembling frame 30 is not intended to limit the invention; in some other embodiments, the bottom plate of the assembling frame may not have any extension portion. In such a configuration, the circuit board may not have any thumb screw thereon, and the circuit board may be fixed on the disk drive cage merely by the hook portions In this embodiment, the bottom plate 33 of the assembling frame 30 has two extension portions 332 located at a side of the bottom plate 33 close to the opening 411 and extending away from the top plate 32. The server chassis 1 may further include two thumb screws 50. The thumb screws 50 are respectively disposed on the extension portions 332, and the thumb screws 50 are respectively screwed into the screw holes 11 of the casing 10, such that the disk drive cage 40 is mounted on the casing 10.

Note that the quantity of the extension portions 332 of the bottom plate 33 of the assembling frame 30 is not intended to limit the invention and may be modified; in some other embodiments, the bottom plate of the assembling frame may have only one extension portion, and therefore the server chassis may include only one thumb screw 50. In another embodiment, the bottom plate of the assembling frame may not have extension portion, and therefore the server chassis may not include any thumb screw 50.

Figure 5:
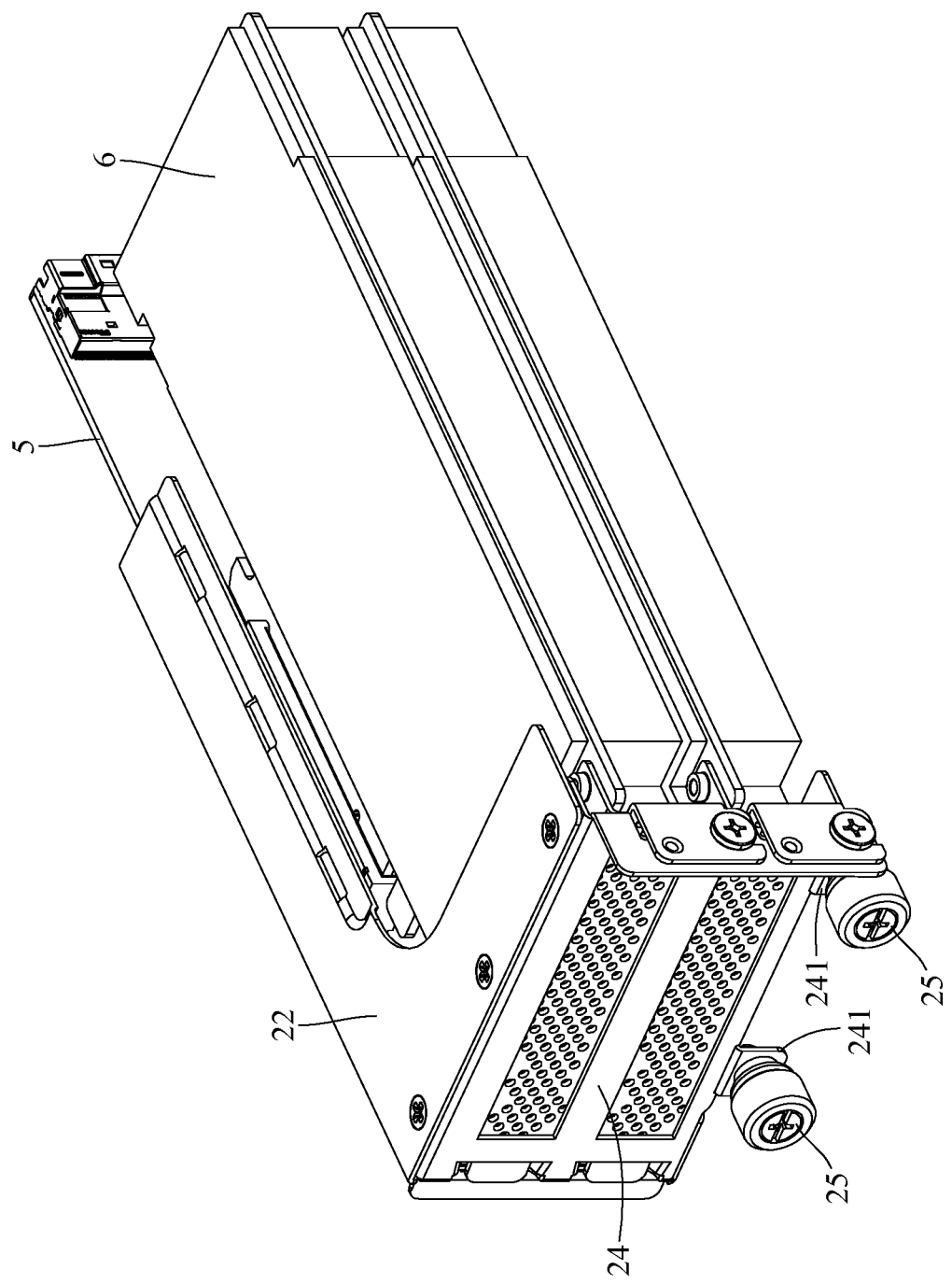
FIG. 5 is a partial perspective view of an expansion card frame with a riser card and expansion cards according to a second embodiment of the invention.
Figure 6:
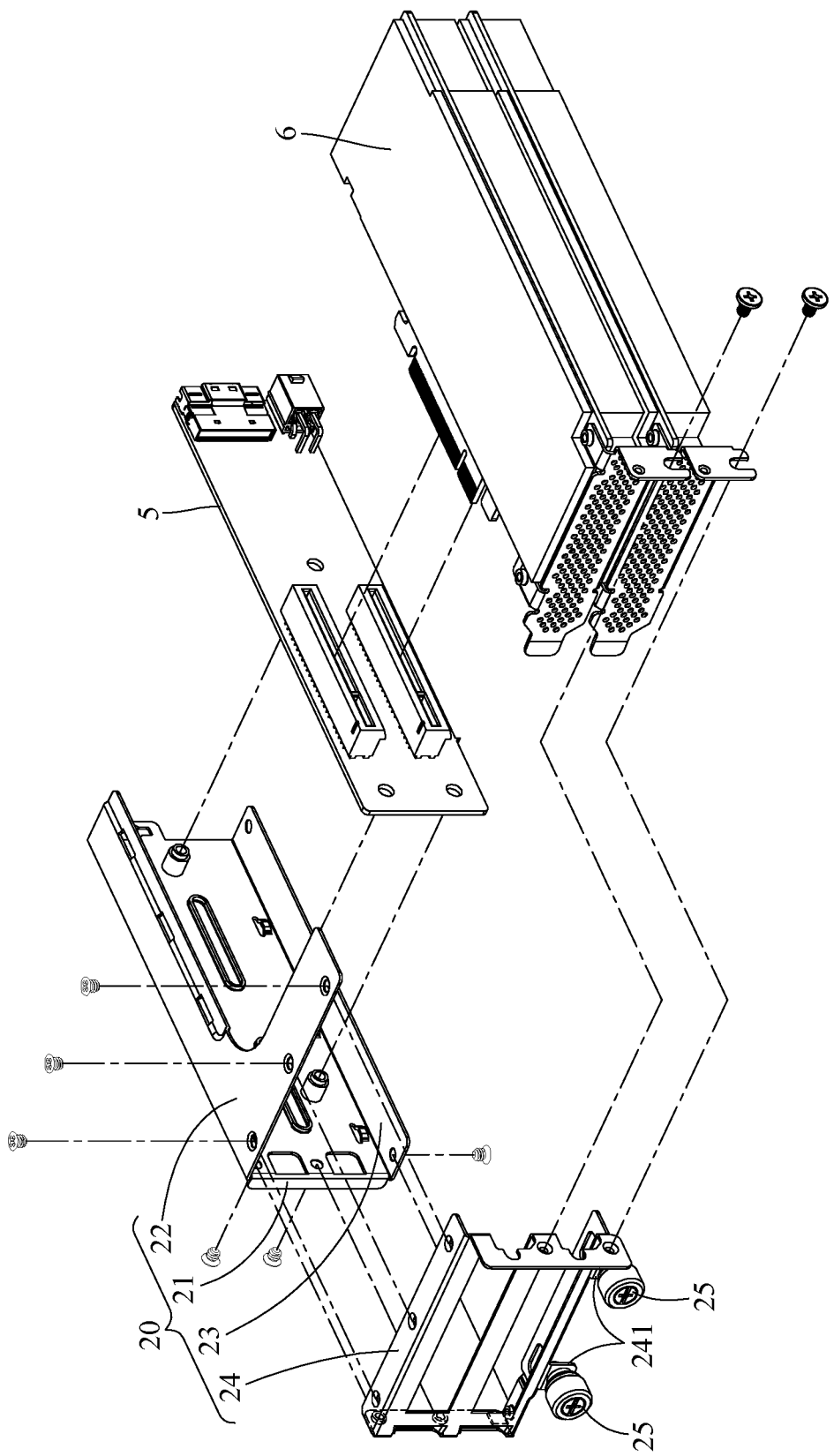
FIG. 6 is an exploded view of the expansion card frame with the riser card and the expansion cards in FIG. 5.
Figure 7:
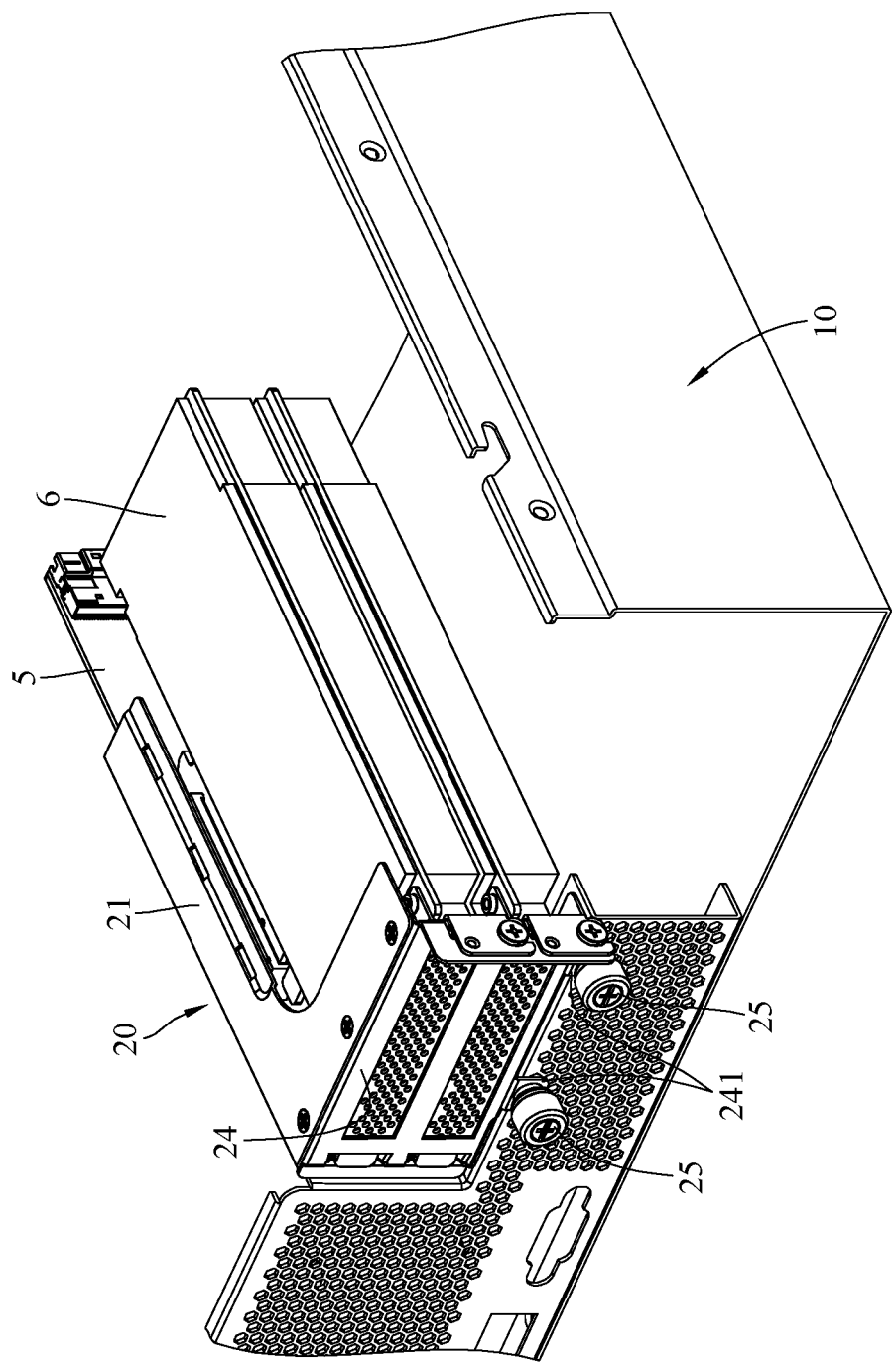
FIG. 7 is a perspective view of the expansion card frame in FIG. 5 when the expansion card frame is mounted on a casing of a server chassis.

In this embodiment, the expansion card frame 20 is a part of the disk drive cage 40, but the present invention is not limited thereto. Referring to FIGS. 5 to 7, there are shown a partial perspective view of an expansion card frame 20 with a riser card 5 and expansion cards 6 according to a second embodiment of the invention, an exploded view of the expansion card frame 20 with the riser card 5 and the expansion cards 6 in FIG. 5, and a perspective view of the expansion card frame 20 in FIG. 5 when the expansion card frame 20 is mounted on a casing 10 of a server chassis 1.

The expansion card frame 20 of this embodiment is partially the same as the expansion card frame 20 of FIG. 3. Specifically, the top plate 22, the side plate 21, and the bottom plate 23 of the expansion card frame 20 of this embodiment are the same as those of the expansion card frame 20 of FIG. 3. Therefore, the following paragraphs will not repeatedly introduce the top plate 22, the side plate 21, and the bottom plate 23 of the expansion card frame 20 of this embodiment.

In this embodiment, the expansion card frame 20 is configured for the installations of the riser card 5 and two expansion cards 6. In detail, the riser card 5 is fixed on the side plate 21 of the expansion card frame 20, for example, via screwing, and the top plate 22 covers the riser card 5. The riser card 5 is configured for the insertion of the expansion cards 6.

In this embodiment, the expansion card frame 20 may further include a support 24. Different sides of the support 24 are respectively fixed to the top plate 22, the side plate 21, and the bottom plate 23 via screwing. The support 24 is configured to support the expansion cards 6.

Note that the support 24 is not restricted to be fixed to the top plate 22, the side plate 21, and the bottom plate 23 via screwing; in some other embodiments, the support may be fixed to the top plate, the side plate, and the bottom plate via another manner (e.g., adhering manner or snap-fit manner).

In this embodiment, the expansion card frame 20 may further include two thumb screws 25. The support 24 has two extension portions 241 extending away from the top plate 22. The thumb screws 25 are respectively disposed on the extension portions 241. The thumb screws 25 are configured to be respectively screwed into the screw holes 11 of the casing 10 (shown in FIG. 1), such that the expansion card frame 20 is mounted on the casing 10.

Note that the bottom plate 23 is an optional component; in some other embodiments, the bottom plate may be omitted. In such a configuration, the support has two sides fixed to the top plate and the side plate. In addition, the support 24 is optional in the invention; in some other embodiments, the expansion card frame may not include the support.

As the expansion card frames and the server chassis discussed in the above embodiments, the expansion card frame not only can be used for the installation of the expansion card, but also can be assembled with the assembling frame to form the disk drive cage for accommodating the disk drive. As such, the expansion card frame can be served as a part of the disk drive cage so as to reduce the inventory of the expansion card frames.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A server chassis, configured to accommodate a disk drive, the server chassis comprising:
   a casing;
   an expansion card frame, comprising a side plate, a top plate, and a bottom plate, wherein the top plate and the bottom plate are respectively connected to two opposite sides of the side plate; and
   an assembling frame, wherein two opposite sides of the assembling frame are respectively fixed to the top plate and the bottom plate of the expansion card frame so that the expansion card frame and the assembling frame together form a disk drive cage having an accommodation space, the accommodation space is configured to accommodate the disk drive, and the disk drive cage is mounted on the casing,
   wherein the top plate of the expansion card frame has at least one assembling structure, the assembling frame comprises a top plate, a side plate, and a bottom plate, the top plate and the bottom plate of the assembling frame are respectively connected to two opposite sides of the side plate of the assembling frame, the top plate of the assembling frame has at least one assembling structure, the at least one assembling structure of the top plate of the expansion card frame is assembled with the at least one assembling structure of the top plate of the assembling frame, and the bottom plate of the assembling frame is fixed to the bottom plate of the expansion card frame via screwing;
   wherein the accommodation space has an opening, each of the side plate of the assembling frame and the side plate of the expansion card frame has a hook portion located at a side of the side plate located away from the opening, the bottom plate of the assembling frame has an extension portion located at a side of the bottom plate located away from the opening, the extension portion has a screw hole, the hook portions are configured to hook on a circuit board into which the disk drive is inserted, and a thumb screw disposed on the circuit board is configured to be screwed into the screw hole.

2. The server chassis according to claim 1, wherein the top plate of the assembling frame comprises a first plate portion and a second plate portion, the first plate portion is located closer to the bottom plate of the assembling frame than the second plate portion, the at least one assembling structure of the top plate of the assembling frame is located at the second plate portion, the top plate of the expansion card frame is stacked on the first plate portion of the top plate of the assembling frame and fixed to the first plate portion of the top plate of the assembling frame via screwing, and an outer surface of the top plate of the expansion card frame is flush with an outer surface of the second plate portion of the top plate of the assembling frame.

3. The server chassis according to claim 2, wherein the top plate of the expansion card frame has a recess, the recess is formed at the outer surface of the top plate of the expansion card frame, the at least one assembling structure of the top plate of the expansion card frame is an insertion hole and located in the recess, the at least one assembling structure of the top plate of the assembling frame is a protrusion, and the second plate portion of the top plate of the assembling frame is partially located in the recess.

4. The server chassis according to claim 1, further comprising at least one thumb screw, wherein the accommodation space has an opening, the bottom plate of the assembling frame has at least one extension portion located at a side of the bottom plate close to the opening and extending away from the top plate of the assembling frame, and the at least one thumb screw is disposed on the at least one extension portion and screwed into the casing.

* * * * *